United States Patent
Lee et al.

(10) Patent No.: US 10,217,892 B2
(45) Date of Patent: Feb. 26, 2019

(54) TANDEM SOLAR CELL

(71) Applicant: EPISTAR CORPORATION, Hsinchu (TW)

(72) Inventors: Rong-Ren Lee, Hsinchu (TW); Yung-Szu Su, Hsinchu (TW); Shih-Chang Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/219,788

(22) Filed: Jul. 26, 2016

(65) Prior Publication Data

US 2016/0336478 A1 Nov. 17, 2016

Related U.S. Application Data

(60) Continuation of application No. 14/161,255, filed on Jan. 22, 2014, which is a division of application No. 12/686,169, filed on Jan. 12, 2010, now abandoned.

(30) Foreign Application Priority Data

Jan. 12, 2009 (TW) .............................. 098100992 A

(51) Int. Cl.
*H01L 31/18* (2006.01)
*H01L 31/0725* (2012.01)

(52) U.S. Cl.
CPC .......... *H01L 31/18* (2013.01); *H01L 31/0725* (2013.01); *Y02E 10/50* (2013.01)

(58) Field of Classification Search
CPC ............................ H01L 31/0725; H01L 31/18
See application file for complete search history.

(56) References Cited

U.S. PATENT DOCUMENTS

| | | | |
|---|---|---|---|
| 5,407,491 A | 4/1995 | Freundlich et al. | |
| 5,800,630 A | 9/1998 | Vilela et al. | |
| 6,300,558 B1 | 10/2001 | Takamoto et al. | |
| 6,316,715 B1 | 11/2001 | King et al. | |
| 6,340,788 B1 | 1/2002 | King et al. | |
| 6,586,669 B2 | 7/2003 | King et al. | |
| 7,126,052 B2 | 10/2006 | Fetzer et al. | |
| 2002/0144725 A1* | 10/2002 | Jordan | H01L 31/02167 136/247 |
| 2004/0200523 A1* | 10/2004 | King | H01L 31/036 136/262 |
| 2005/0155641 A1 | 7/2005 | Fafard | |
| 2010/0175746 A1 | 7/2010 | Lee et al. | |

OTHER PUBLICATIONS

Shen, et al., "An In0.53Ga0.47As Tunnel Diode for Monolithic Multifunction Solar Cell Application," IEEE Photovoltaic Specialists Conference Sep. 26-30, 1988, Conference Record vol. I, 1988, pp. 771-776.

* cited by examiner

*Primary Examiner* — Golam Mowla
(74) *Attorney, Agent, or Firm* — Muncy, Geissler, Olds & Lowe, P.C.

(57) ABSTRACT

This application is related to a method of manufacturing a solar cell device comprising providing a substrate comprising Ge or GaAs; forming a first tunnel junction on the substrate, wherein the first tunnel junction comprises a first n-type layer comprising InGaP:Te, and a first alloy layer comprising AlxGa(1−x)As and having a lattice constant; adding a material into the first alloy layer to change the lattice constant; and forming a first p-n junction on the first tunnel junction.

15 Claims, 3 Drawing Sheets

TANDEM SOLAR CELL

REFERENCE TO RELATED APPLICATION

This application is a Continuation of co-pending application Ser. No. 14/161,255, filed on 22 Jan. 2014, which is a Divisional application of co-pending application Ser. No. 12/686,169 filed on 12 Jan. 2010; for which priority is claimed under 35 U.S.C. § 120; and this application claims priority of Application No. 098100992 filed in Taiwan on 12 Jan. 2009 under 35 U.S.C. § 119, the entire contents of all of which are hereby incorporated by reference.

BACKGROUND

Technical Field

This application is related to a tandem solar cell structure.

Description of the Related Art

The solar cell is an energy transferring optoelectronic device that receives sunlight and transfers it into electrical energy.

The tandem solar cell or the multi junction solar cell stacks two or more than two p-n junction elements in series with the same or different energy bandgaps. In general, the p-n junction element which can absorb higher energy spectrum is formed as the upper layer; the p-n junction element which can absorb lower energy spectrum is formed as the bottom layer. By combining the p-n junction elements of different materials, the photon energy can be absorbed layer by layer. It can raise the absorbing rate and efficiency, and decrease the transferring loss.

FIG. 1 illustrates a cross-sectional view of the conventional tandem solar cell structure including a substrate 101, a buffer layer 102, a tunnel junction 103 and a p-n junction 104. Currently, the wildly used tunnel junction 103 includes a heavily doped n-type layer (n++) 1031 and a heavily doped p-type layer (p++) 1032 wherein the heavily doped n-type layer (n++) is generally doped with Silicon, Tellurium or Selenium. The heavily doped p-type layer (p++) 1032 is generally doped with Carbon, Zinc, Magnesium or Beryllium. The lattice constant of the heavily doped p-type layer (p++) 1032 is decreased after doped with Carbon. It increases the lattice constant difference of the tunnel junction 103 and the substrate 101 and impairs the epitaxial quality and the effect of the tunnel junction 103.

SUMMARY

This application is related to a method of manufacturing a solar cell device, comprising providing a substrate comprising Ge or GaAs; forming a first tunnel junction on the substrate, wherein the first tunnel junction comprises a first n-type layer comprising InGaP:Te, and a first alloy layer comprising $Al_xGa_{(1-x)}As$ and having a lattice constant; adding a material into the first alloy layer to change the lattice constant; and forming a first p-n junction on the first tunnel junction.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DESCRIPTION OF THE PREFERRED EMBODIMENTS

Figure 1:
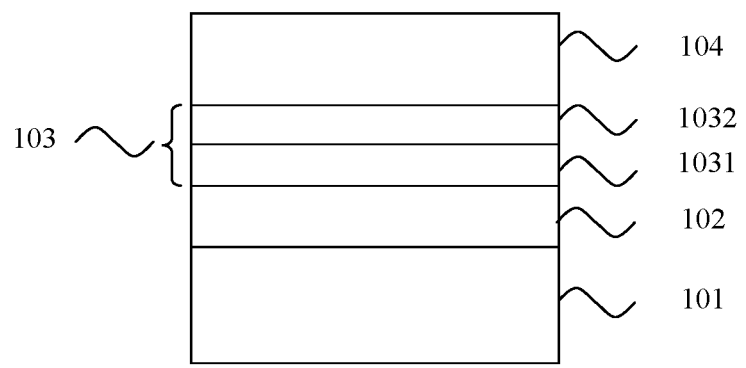
FIG. 1 illustrates a cross-sectional view of the conventional tandem solar cell structure.

Reference is made in detail to the preferred embodiments of the present application, examples of which are illustrated in the accompanying drawings. Wherever possible, the same reference numbers are used in the drawings and the description to refer to the same or like parts.

Figure 2A:
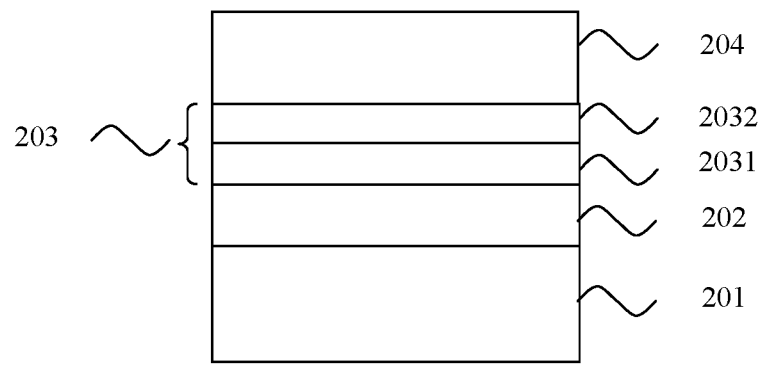
FIG. 2A illustrates a cross-sectional view of the tandem solar cell structure in accordance with one embodiment of the present application.

FIG. 2A illustrates a cross-sectional view of the tandem solar cell structure in accordance with one embodiment of the present application including a substrate 201, a buffer layer 202, a first tunnel junction 203 and a first p-n junction 204. The first tunnel junction 203 includes a heavily doped n-type layer (n++) 2031 and an alloy layer 2032. In this application, the material of the substrate 201 can be Silicon, Germanium, Si—Ge, GaAs or InP. The material of the buffer layer 202, the heavily doped n-type layer (n++) 2031, the alloy layer 2032 and the first p-n junction 204 contains one or more elements selected from the group consisting of Gallium, Aluminum, Indium, Arsenic, Phosphorous, Nitrogen and Silicon, such as $(Al_xGa_{1-x})_yIn_{1-y}As$ or $(Al_xGa_{1-x})_yIn_{1-y}P$.

The alloy layer 2032 comprises a heavily doped p-type layer containing an element with atomic number larger than that of Gallium. A p-type impurity with high doping concentration and an element with atomic number larger than that of Gallium are added in the p-type layer in the epitaxial process to form the alloy layer 2032 having a heavily doped p-type layer with an element with atomic number larger than that of Gallium. The lattice constant of the alloy layer 2032 is increased by the content of the added element with atomic number larger than that of Gallium to decrease the lattice mismatch of the alloy layer 2032 and the substrate 201 so the quality of the epitaxial layers improved. Besides, the energy gap of the alloy layer 2032 is decreased by adding the element with atomic number larger than that of Gallium. The Jp (current density), and the Jp/Vp (slope of current density to voltage) of the alloy layer are increased and the tunneling current of the first tunnel junction 203 is increased. The material of the element with atomic number larger than that of Gallium can be selected from Indium, Thallium, Antimony, Bismuth, Tin, Lead, Bismuth, Polonium, Cadmium, and Mercury. The concentration of the element with atomic number larger than that of Gallium can be 1~2%, which is equal to $3.5 \times 10^{21} \sim 1.7 \times 10^{22}$ (l/cm$^3$).

Figure 2B:
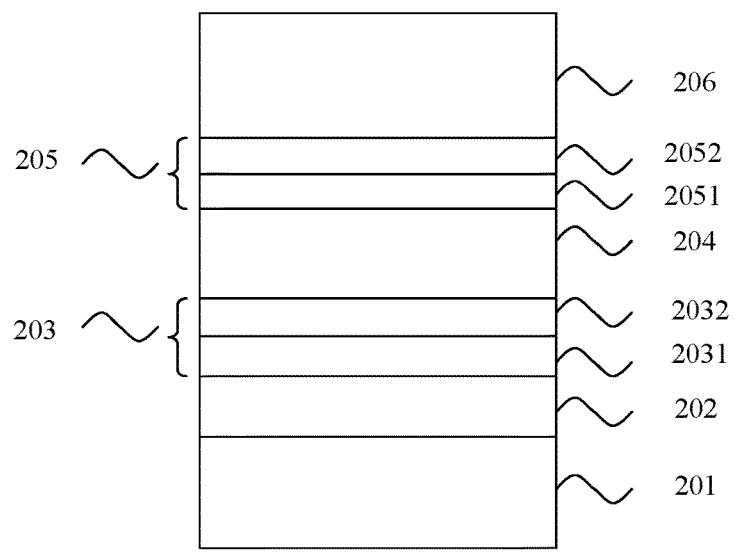
FIG. 2B illustrates a cross-sectional view of the tandem solar cell structure in accordance with another embodiment of the present application.

FIG. 2B illustrates a cross-sectional view of the tandem solar cell structure in accordance with another embodiment of the present application including a substrate 201, a buffer layer 202, a first tunnel junction 203, a first p-n junction 204, a second tunnel junction 205 and a second p-n junction 206. The first tunnel junction 203 and the second tunnel junction 205 include heavily doped n-type layers (n++) 2031, 2051 and alloy layers 2032, 2052.

In this application, the material of the substrate 201 can be Silicon, Germanium, Si—Ge, GaAs or InP. The material of the buffer layer 202, the heavily doped n-type layers (n++) 2031, 2051, the alloy layers 2032, 2052, the first p-n junction 204 and the second p-n junction 206 contains one or more elements selected from the group consisting of Gallium, Aluminum, Indium, Arsenic, Phosphorous, Nitrogen and Silicon, such as $(Al_xGa_{1-x})_yIn_{1-y}As$ or $(Al_xGa_{1-x})_yIn_{1-y}P$.

The alloy layers 2032, 2052 comprise a heavily doped p-type layer containing an element with atomic number larger than that of Gallium. A p-type impurity with high doping concentration and an element with atomic number larger than that of Gallium are added in the p-type layer in the epitaxial process to form the alloy layer 2032, 2052 having a heavily doped p-type layer with an element with atomic number larger than that of Gallium. The lattice constant of the alloy layers 2032, 2052 is increased by the content of the added element with atomic number larger than that of Gallium to decrease the lattice mismatch of the alloy layers 2032, 2052 and the substrate 201 so the quality of the epitaxial layers is improved. Besides, the energy gap of the alloy layers 2032, 2052 is decreased by adding the element with atomic number larger than that of Gallium. The Jp (current density), and the Jp/Vp (slope of current density to voltage) of the alloy layers are increased and the tunneling current of the first tunnel junction 203 is also increased. The material of the element with atomic number larger than that of Gallium can be selected from Indium, Thallium, Antimony, Bismuth, Tin, Lead, Bismuth, Polonium, Cadmium, and Mercury. The concentration of the element with atomic number larger than that of Gallium can be 1~2%, which is equal to $3.5 \times 10^{21} \sim 1.7 \times 10^{22}$ (1/cm$^3$).

In one embodiment, the material of the substrate 201 is Germanium. The material of the heavily doped n-type layers (n++) 2031, 2051 of the first and the second tunnel junction 203, 205 is InGaP:Te. The material of the alloy layer 2032, 2052 is $Al_xGa_{(1-x)}As:C+$ and is doped with In to form the $In_yAl_xGa_{(1-x)}As$ alloy. The alloy layer can decrease the lattice mismatch and increase the tunneling current of the tunnel junction.

Figure 3:
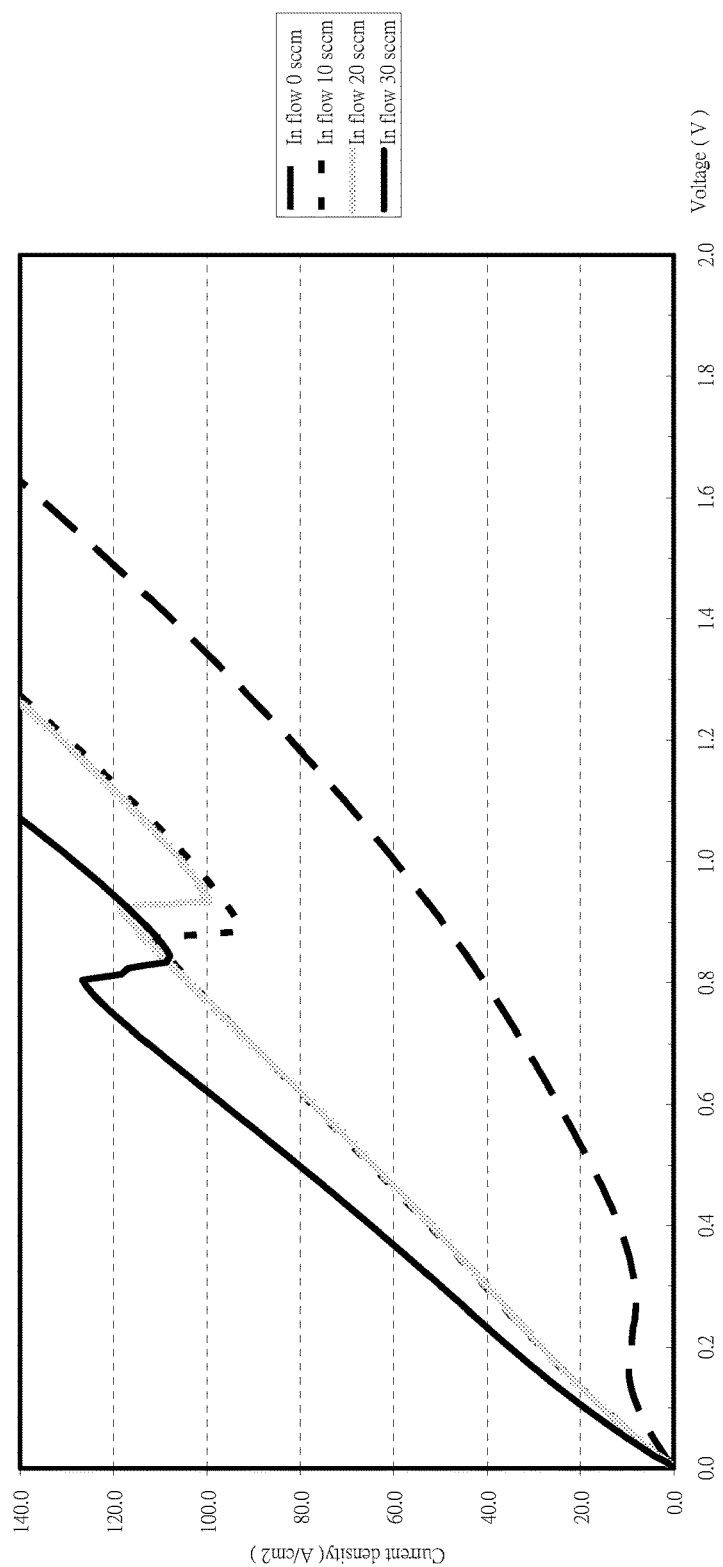
FIG. 3 illustrates the I-V curve of the alloy layer with different concentration of Indium in the tunnel junction in accordance with one embodiment of the present application.

FIG. 3 illustrates the I-V curve of the alloy layer with different concentration of Indium in the tunnel junction in accordance with one embodiment of the present application. By increasing the adding concentration of Indium, the slope of the I-V curve is increased and the tunnel current through the first and the second tunnel junction 203, 205 is also increased.

In other embodiment of this application, a third tunnel junction can be formed on the second p-n junction 206 and a third p-n junction can be formed on the third tunnel junction. The tunnel junctions and the p-n junctions can be stacked repetitively based on the requirement of the product and there is no need to limit the number of the p-n junction in the tandem solar cell. The design of the tunnel junction is substantially the same as the embodiment mentioned above and can be referred thereto.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A method of manufacturing a solar cell device, comprising:
   providing a substrate comprising Ge or GaAs;
   forming a first tunnel junction on the substrate, comprising:
      forming a first n-type layer, and
      forming a first p-type layer comprising a first material and a first element comprising In, Tl, Sb, Bi, Sn, Pb, Te, Po, Cd or Hg;
   forming a first p-n junction on the first tunnel junction;
   forming a second tunnel junction on the first p-n junction, comprising:
      forming a second n-type layer comprising InGaP:Te; and
      forming a second p-type layer, the second p-type layer comprising a second material $Al_xGa_{(1-x)}As$ and a second element comprising In, Tl, Sb, Bi, Sn, Pb, Te, Po or Hg; and
   forming a second p-n junction on the second tunnel junction,
   wherein a concentration of the second element is 1~2%.

2. The method of claim 1, wherein the first material comprises $AlGa_{(1-x)}As$.

3. The method of claim 2, wherein a concentration of the first element is 1%-2%.

4. The method of claim 2, further comprising:
   forming a third tunnel junction on the second p-n junction, wherein the third tunnel junction comprises a third p-type layer; and
   forming a third p-n junction on the third tunnel junction.

5. The method of claim 4, wherein the third p-type layer having a third material and a third element comprising In, Tl, Sb, Bi, Sn, Pb, Te, Po, Cd or Hg, and a concentration of the third element is 1%-2%.

6. The method of claim 1, further comprising a step of forming a buffer layer between the first tunnel junction and the substrate.

7. The method of claim 6, wherein the buffer layer, the first tunnel junction, or the first p-n junction comprises one selected from the group consisted of Gallium, Aluminum, Indium, Arsenic, and Phosphorous.

8. The method of claim 1, wherein the first p-type layer comprises carbon, zinc, magnesium or beryllium.

9. The method of claim 1, wherein the first n-type layer comprises Te.

10. The method of claim 8, wherein the first p-type layer comprises carbon.

11. A solar cell device, comprising:
   a substrate comprising Ge or GaAs;
   a first tunnel junction on the substrate; comprising:
      a first n-type layer, and
      a first p-type layer comprising a first material and a first element comprising In, Tl, Sb, Bi, Sn, Pb, Te, Po, Cd or Hg;
   a first p-n junction on the first tunnel junction;
   a second tunnel junction on the first p-n junction, comprising:
      a second n-type layer comprising InGaP:Te, and
      a second p-type layer, and the second p-type layer comprising a second material of $Al_xGa_{(1-x)}As$ and a second element comprising In, Tl, Sb, Bi, Sn, Pb, Te, Po or Hg; and
   a second p-n junction on the second tunnel junction,
   wherein a concentration of the second element is 1~2%.

12. The solar cell device of claim 11, further comprising a buffer layer between the first tunnel junction and the substrate.

13. The solar cell device of claim 11, wherein the first tunnel junction, the first p-n junction and the second p-n junction comprise one selected from the group consisting of Gallium, Aluminum, Indium, Arsenic, Phosphorous, Nitrogen and Silicon.

14. The solar cell device of claim 11, wherein the first n-type layer comprises Te.

15. The solar cell device of claim 11, wherein the first p-type layer comprises carbon.

* * * * *